(12) United States Patent
Jennings

(10) Patent No.: US 6,169,703 B1
(45) Date of Patent: Jan. 2, 2001

(54) METHOD FOR CONTROLLING HIGH SPEED DIGITAL ELECTRONIC MEMORY

(75) Inventor: Kevin F. Jennings, Novi, MI (US)

(73) Assignee: Unisys Corp., Blue Bell, PA (US)

( * ) Notice: Under 35 U.S.C. 154(b), the term of this patent shall be extended for 0 days.

(21) Appl. No.: 08/861,274

(22) Filed: May 21, 1997

(51) Int. Cl.[7] .................................. G11C 8/00; G11C 7/00
(52) U.S. Cl. ............... 365/233; 365/189.01; 365/189.05; 365/189.08
(58) Field of Search ............................. 365/233, 189.01, 365/189.05, 189.08

(56) References Cited

U.S. PATENT DOCUMENTS 5,680,591 * 10/1997 Kansal et al. ..................... 365/233

* cited by examiner

Primary Examiner—David C. Nelms
Assistant Examiner—Trong Phan
(74) Attorney, Agent, or Firm—Mark Starr; J. McCormack

(57) ABSTRACT

A method for controlling a high speed memory unit M to be read from, and written to, as initiated by clock signals of comparable speed, this method involving: providing a timing coordinator unit with bi-stable store for storing and presenting certain input signals to the memory unit in conjunction with the clock signals so as to be immediately useable thereby and so that the memory unit can responsively output data to a user stage; these input signals being arranged to include commands R/W to Read or Write, Address signals and Data signals; and the memory unit being maintained in "ready-to-read" condition at all times except during receipt of write commands.

14 Claims, 2 Drawing Sheets

MEMORY TIMING DIAGRAM

METHOD FOR CONTROLLING HIGH SPEED DIGITAL ELECTRONIC MEMORY

This disclosure involves controlling electronic high speed memory devices while running them as fast as possible, and maximizing memory bandwidth and utilization.

Some Salient Themes Hereof Are

Maximizing the operating speed (and bandwidth) of a high speed memory unit (e.g. static RAM), as initiated by a compatible high-frequency clock source, using a bi-stable stage for in-storage (or timing coordinator) of input address, data and Rd/Wr commands (pref. a flip-flop for each of these three), with data-out on a data bus (pref. same as data-in bus, coupled to data-in flip flop) and arranged to be in "perpetual read-enable" state except during write operations.

The data-out bus preferably feeds a bi-stable out-store buffer, also controlled by the clock and a read-flip-flop, which is coupled to the memory (Read input) via Inverter means.

Thus, an object hereof is to address and resolve at least some of these problems and provide at least some of the here-described features.

Other objects and advantages of the present invention will be apparent to those skilled in the art.

BRIEF DESCRIPTION OF THE DRAWINGS

The foregoing and other features and advantages of the present invention will be appreciated by workers as they become better understood by reference to the following detailed description of the present preferred embodiments, these being considered in conjunction with the accompanying drawings, wherein like reference symbols denote like elements:

FIG. 1 is an idealized diagram of a circuit embodiment hereof, while:

The invention will be better appreciated by workers upon consideration of the following detailed description of preferred embodiments.

DETAILS OF PREFERRED EMBODIMENT

The means discussed herein will generally be understodd as selected, formulated, and operating as presently known in the art, except whre otherwise specified. And, except as otherwise specified, all materials, methods, and devices and apparatus herein will be understood as impremented by known expedients according to present good practice.

For the FIG. 1 circuit schematic, the inputs and outputs of the system are defined in the following Table I. Signals with an '_N' suffix are considered to be 'active-low'. That is, the signal is a logical 'true' when the signal is at a low voltage level, and is a logical 'false' when the signal is at a high voltage level. With one exception the 'polarity' of a signal (i.e. active-high or active-low) is not relevant to this discussion. Signals were chosen to conform with the polarity conventions of commonly available parts. The one exception is the relationship between the 'W' input to the memory M (see FIG. 1; W controls writing to memory) and the clock edge that causes flip-flops to transition.

Figure 1:
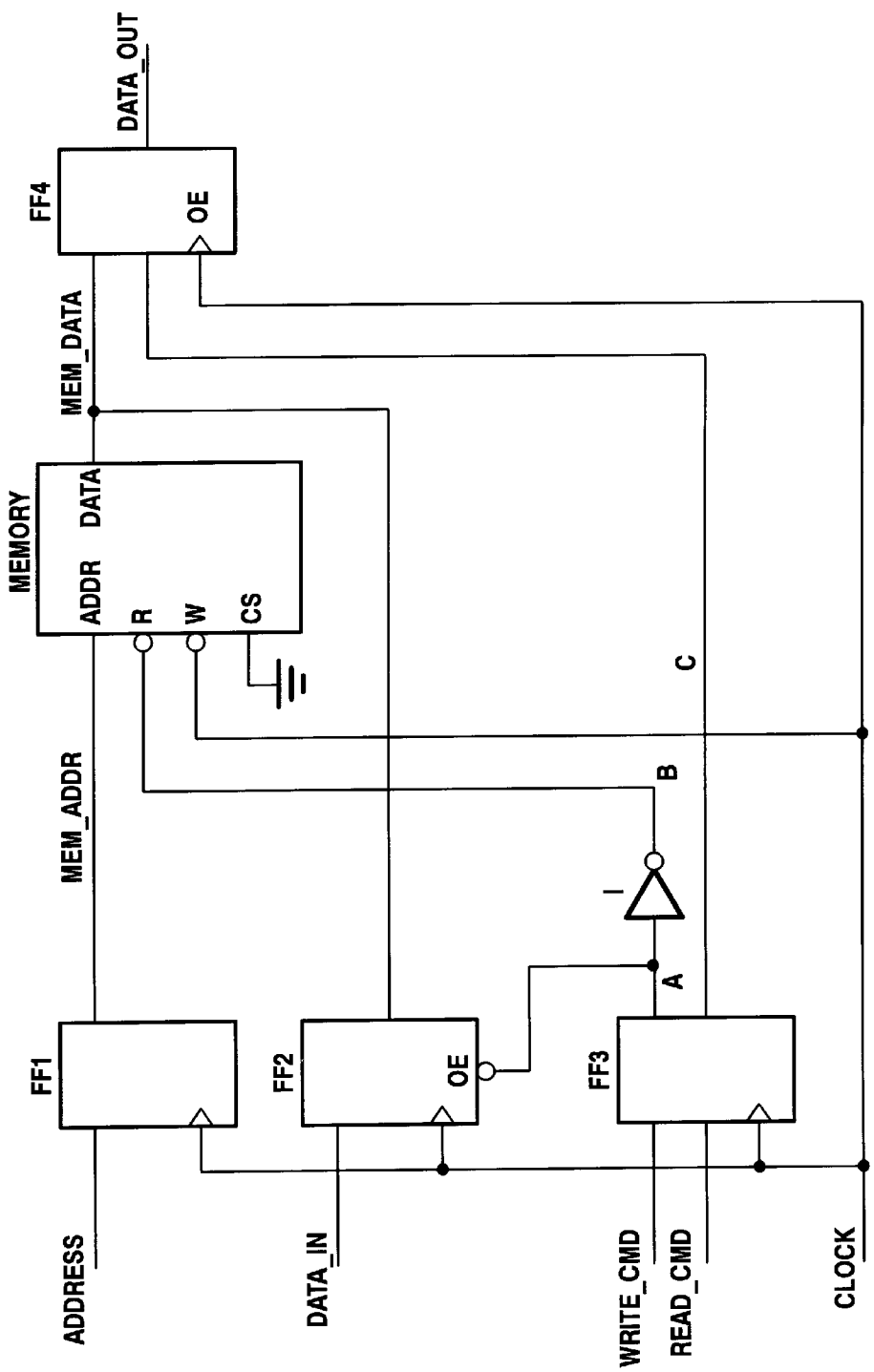

The FIG. 1 schematic assumes that flip flops change on the "low to high" transition of a clock signal and that memory M is written to when 'W' is low. With most commercially available parts this is the convention that is used, however, if the 'W' input is instead "active high", then the flip-flops would need to transition on the "high to low" transition of the clock.

The flip flops that generate the memory address and control signals (FF1, FF2, FF3 and FF4, see FIG. 1) are here made part of the environment in which the invention is being operated. They may represent part of a familiar processor. The purpose of showing them is to emphasize the assumed timing relationship between the various signals and the system clock.

TABLE I

| Signal Name | Definition |
| --- | --- |
| CLOCK | System clock from which all timing references are made. All flip-flops change state on the low to high transition of CLOCK. |
| ADDRESS | Memory address to be read or written |
| DATA IN | Data to be written to memory |
| DATA OUT | Data read out of memory (may be the same as DATA IN) |
| WRITE CMD_N | Command to write data to memory |
| READ CMD_N | Command to read data from memory |
| MEM ADDR | Address inputs to the memory device |
| MEM DATA | Data input/outputs to/from the memory device |

Memory M: I prefer the fastest memory available; e.g. static RAM (because the inverter wants to access it as quickly as possible); thus slower memory such as Dynamic RAM will be non-preferable.

The terminals of memory M (inputs ADDR, W, R, DATA) will be self-evident as to function; terminal CS is "Chip Select" and amounts to ON/OFF e.g. where M is one of many memory units in a bank of such.

Clock: any compatible high-frequency clock source; e.g. matching the speed of a static RAM memory used (e.g. if memory operates at about 10 nanoseconds, the clock frequency might best be about 40 MHz). Duty cycle will preferably be about 50%.

Flip-Flops: (or like bi-stable storage) should be compatible with such an ultra-fast memory, and as indicated in FIG. 1 (with tri-state operation for FF-2, FF-4; note OE: output-enable terminals; e.g. for easy entry/exit to a bus).

Workers will appreciate that FF-1, -2, -3 store and maintain their respective inputs (ADD., DATA_IN, Wr/R commands) at respective input terminals to memory M so as to be immediately useable in M when these are triggered (by Clock pulse), without concern for duration or fine-timing of these inputs (e.g., located close to M to allow propagation time to be ignored). As workers realize, such an array of flip-flops (or like bi-stable storage units) tolerate much looser, less stringent timing parameters (e.g. set-up time) than a memory unit like M (e.g., static RAM, apt to have longer, more stringent timing requirements).

Thus the array TC of flip-flops FF1, -2, -3 preferably functions as an inexpensive, simple "timing buffer", or "timing-coordinator" TC. Without coordinator TC (e.g., applying these three inputs directly to M), other added measures would have to be taken to assure coordination with the initiating (CLOCK) pulse, or else operation would be compromised or suspect.

Inverter I: will be understood as inverting a "write" (e.g. pulse A from FF-3, or data from FF-2) as applied to READ input R of memory M—as pulse B; so a "Write-True" is converted to "Write-False", which, here, equates to "allowing READ"; i.e. M allows READ at all times except during WRITE.

Any realizable digital electronic part will have timing parameters that must be taken into consideration when using the part in a real design. For the parts shown the important parameters are (also see FIG. 2):

$T_{co}$ for a flip flop: this is the time it takes from the rising edge of the clock input for the outputs to change state and stabilize.

$T_{su}$ for flip flop: this is the time that the data input to the flip flop must be stable prior to the rising edge of the clock input.

$T_r$ for a memory device is the time from the initiation of a read cycle until the outputs are stable.

$T_w$ for a memory device is the time from the initiation of write cycle during which the address and data inputs must be stable.

In general, for common commercially available high speed parts, times $T_w$ and $T_r$ are roughly equal in length (or $T_w$ may be slightly less). $T_{co}$ and $T_{su}$ usually quite a bit less than $T_w$ or $T_r$, but are generally within an order of magnitude of each other. The exact values are not relevant to the discussion of the subject invention; the important consideration is that the various parameters are generally close enough in numerical value that it is not a valid assumption to ignore one or the other when designing a real system.

Other timing parameters (such as clock skew between devices), while important to the design of a real system, are not relevant to the discussion of this invention.

Figure 2:
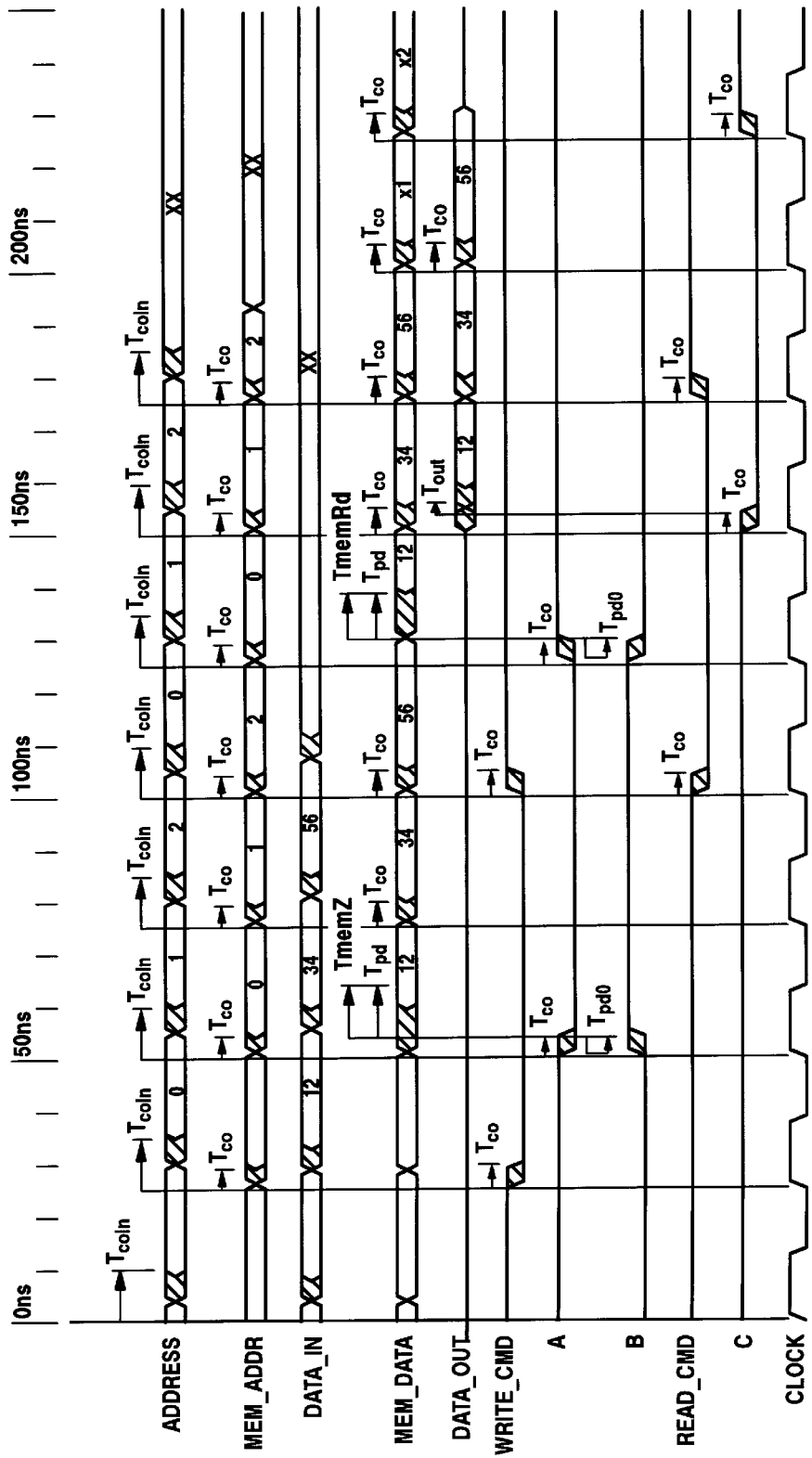
FIG. 2 gives a related timing diagram.

FIG. 2 is a Memory Timing diagram, described as follows:

How it Works

The signals Address, DATA_IN, WRITE_CMD and READ_CMD are the inputs from the system that this memory unit serves. The signal DATA_OUT is the output. In general, Address, DATA_IN and DATA_OUT are typically on busses (i.e. several bits wide). Typically, DATA_IN and DATA_OUT also represent the same physical data bus, since whatever is addressing the memory generally wants to both read and write to the memory, not just one or the other. They are shown in this timing diagram (FIG. 2) as separate signals to illustrate the data flow.

The signal WRITE_CMD, when low indicates that the system intends to write the data contained on DATA_IN to memory M. The signal READ_CMD, when low, indicates that the system intends to read data from memory on DATA_OUT. The memory is written to when its CS and W inputs are both low.

The preferred memory device M is typically 'fast', since the purpose of the circuit is to provide an architecture for controlling memory in a high performance system. With current technology, the memory unit M is preferably a static RAM. Memory M is read from when its CS and R inputs are both low. The flip flops (FIG. 1) FF1 through FF4 are standard flip flop devices which store whatever is on their data input pins at the time that their clock input changes from a low to a high.

Flip-flops FF2, FF4 include an OE (output enable) pin input and so are capable of 'tri-stating' their outputs. When OE is low the outputs of such a flip flop act identically to a flip flop without such an input. When OE is high, however, the flip flop does not drive its outputs at all. This functions like an "OFF control", and allows multiple devices to exist on the same bus (in this example, both FF2 and memory M are capable of driving MEM_DATA on the MEM_DATA bus).

The timing diagram (FIG. 2) shows an example of three consecutive "writes to" memory, followed by three consecutive "reads" from memory, followed by two cycles where neither a read nor a write is commanded by the system.

The write cycle examples show: a write to address 0 with data 12, (see ADDRESS, DATA_IN) followed by a write to address 1 with data 34, followed by a write to address 2 with data 56.

The read cycle examples show a read of the same three addresses, reading back the same data that was previously written.

For the write cycles, WRITE_CMD going active causes the signal A (FIGS. 1,2) to go active; this is used to enable FF2 (FIG. 1) to drive the MEM_DATA bus. Signal A is then inverted (i.e. from low to high or from high to low at invertor I) to generate signal B which is used to command memory M to read. In the preferred implementation, this inverter I (FIG. 1) can be incorporated into FF3 so as not to cause any additional delay in the circuit.

For the read cycles, READ_CMD going active causes the signal C to go active two clock ticks later (i.e. it is delayed by two flip flop delays) which causes FF4 to enable its data on to the DATA_OUT bus. As mentioned previously, typically DATA_IN and DATA_OUT are preferably physically on the same bus; this is why FF4 needs to be able to shut off the DATA_OUT bus.

Regardless of whether WRITE_CMD or READ_CMD is active, or if they are both inactive, memory M is written to on every clock cycle, since the memory write input is connected to the clock. Therefore, for two clock cycles where neither a read nor a write is commanded, the system will also be seen to insure that the state of memory M does not change, even though it is actively being written to. Assuming that the memory device M is capable of simultaneously being written to, and read from,—then, the signal B will be active whenever a write is not being commanded via WRITE_CMD. The Address input is unknown which causes the memory address MEM_ADDR to be unknown (represented in the timing diagram as XX). While it is unknown it will be stable for the entire clock cycle since it comes out of a flip flop. This causes the memory to read from some address and put out the data on MEM_DATA. When the clock signal goes low, it initiates a write to memory, thereby writing the same data back into memory. If memory device M does not support simultaneous read and write, then the write will be ignored since a read gets initiated first. In either case the state of the memory is unchanged; this is the desired result since the system was not commanding a read or write.

Important Characteristics of the Invention

Other important points about the invention can be seen from the foregoing, such as the following:
The memory device M is being read from whenever the system is not explicitly commanding a "write to memory". This means that even if the system is not currently attempting to read or write, memory M is being read from.

Memory device M is being written to on every clock cycle (specifically, on the second half of the clock cycle when the clock signal is low).

When the system commands data to be written into memory M, it will drive the memory device data signals MEM_DATA (on MEM_DATA bus), and the data will be written into memory on the second half of the clock. When the system commands data to be read from memory, the data will become available before the rising edge of the next clock cycle. Both reads and writes are accomplished in a single clock cycle.

When the system is neither commanding to read nor to write, it will read from memory M whatever address is being selected by the signals MEM_ADDR, and it will also simultaneously write the data back to the same location. Since the same data that was read out is also being written back in, no actual change in the state of the memory will have occurred; therefore, the invention has not changed that state of the system without being commanded to (by the system).

Advantages Over Other Practices

There are several possible solutions to the design of the memory system which include the effects of the timing parameters of real devices (as mentioned previously). In general, the main problem to solve is writing to memory. Writing is considered 'more difficult' since the address inputs to the memory must be guaranteed to be absolutely stable before the memory device is commanded to start writing. Furthermore, the address inputs must remain stable until after the memory device write command has ended. If the address inputs are not stable, then it is possible that several addresses, could be written to, thereby corrupting the memory.

Thus, let me compare the 'write performance' of various alternatives to how this invention writes (with the understanding that 'read performance' is not an issue) as follows:

Each of these other solutions may be considered 'optimal' in some sense. They may require fewer parts, or the total cost may be less than this invention; but what is focused-upon in this invention is maximizing the available system memory bandwidth for memory of a given speed and logic family.

Alternative A: Three Clock Cycle Write, Two Clock Cycle Read

In this scheme, the address is set up on the first clock cycle, the write is performed on the second cycle, nothing is done on the third clock cycle (in a write—during a read there is no need for a third clock cycle). This guarantees that the address is stable for one clock cycle, both before and after the memory device is commanded to write.

At first, it would appear that the write performance of this approach would be ⅓ that of my invention, but since the write signal of this approach is 1 clock cycle wide (instead of ½ clock cycle as in my invention), this would imply that either a slower speed memory device could be used or the clock frequency could be doubled. Since the stated criteria require a comparison using "equal speed memory", then this approach A must use a clock cycle of twice the frequency of the invention for purposes of comparison. The net result is that, if my invention uses a clock signal with period 'T' seconds then it can accomplish a write in 'T' seconds, whereas approach A would require '1.5T' seconds (i.e., more time), therefore the write performance of A is inferior. The read performance of A is equivalent to my invention, both taking 'T' seconds.

Alternative B: Chip Select, Controlled Write

A memory device can have, in addition to a read and write control, a third control called 'chip select' (In the schematic FIG. 1 for this invention, the chip select input is grounded, thus, essentially, selecting the chip all the time). When "chip select" is inactive, the memory device does not respond to activity on either the read or write control signals. The idea here is that the read, write, address (and data (luring a write) would all change at the rising edge of the clock, and would eventually stabilize during the first half of the clock cycle. The clock signal here would be used as "chip select" to select the memory device during the second half of its clock cycle.

This scheme has identical write performance to my invention, but its read performance is quite likely inferior—because the reason the read from memory for scheme B doesn't begin until the chip is selected, but the memory device must then be "held selected" long enough not only for the memory device to respond ($T_r$ from above), but also long enough to satisfy the setup time of the receiving flip flop ($T_{su}$ from above). The critical time, then, is $T_r+T_{su}$—whereas for my invention the critical time is $T_w$—since, with my invention, the read of the memory device will begin at the start of a clock cycle. As mentioned above, $T_w$, is generally the same or less than $T_r$ which implies that $T_r+T_{su}$ will be greater than $T_w$. This, in turn, implies that, for a given speed of memory, this method B will require a longer clock cycle then my invention—implying that the bandwidth of system B will be less.

Alternative C: Delay Line and Logic Controlled Write

In this scheme, when the system commands a write, the write command enters a delay line with at least two taps. The delay line tap outputs would go into a logic gate which would then generate a write pulse, starting when the write command reaches the first delay line tap, and ending when the write command reaches the second delay line tap. Assuming that a suitable delay line can be found, the intent here is to initiate a write pulse only after the address is stable, and to end a write pulse at a time prior to, or coincident with the, rising edge of the next clock.

This method (C) can be inferior to my invention since both the delay line and the logic gate introduce some additional uncertainty into exactly where the pulse will finally end up. Whether or not it is actually inferior depends on the characteristics of the technology used. For example, with commercially available CMOS components, the additional uncertainty will be on the order of 1–5 nanoseconds, whereas using a crystal controlled oscillator to drive a clock generator to generate an asymmetric clock for my invention would result in less uncertainty: approximately 1–2 nanoseconds.

Since currently available CMOS memory devices have access time on the order of 10–15 nanoseconds, the extra few nanoseconds of uncertainty is a non-trivial percentage of the cycle time of this memory. A design which tolerates his extra uncertainty would have lower bandwidth than a design using my invention. Unlike the previous cases (methods A, B) it cannot be stated unequivocally that my invention is superior to this approach (C). Whether it is or not depends strongly on the system requirements and the characteristics of the technology of the system parts.

Of course, modifications to the preferred embodiment described are possible without departing from the spirit of the present invention.

Accordingly, the description of the preferred embodiment should be to be considered as including all possible modifications and variations coming within the scope of the invention as defined by the appended claims.

What is claimed is:

1. A method for controlling a high speed memory means to be read from, and written to, as initiated by clock signals from clock means of comparable speed, this method involving:

providing timing coordinator means with bi-stable store means for storing and presenting certain input signals to said memory means in conjunction with said clock signals so as to be immediately useable by said memory means and so that this memory means can responsively output data to user means;

said input signals being arranged to include commands to Read or Write, Address signals and Data signals; and said memory means being maintained in "ready-to-read" condition at all times except during receipt of write commands.

2. The method of claim 1 wherein said memory means comprises static RAM means.

3. The method of claim 2 wherein said timing coordinator means includes bi-stable storage means for said ADDRESS, signals, for said DATA signals and for write/read commands.

4. The method of claim 3 wherein each said bi-stable storage means comprises flip-flop means.

5. The method of claim 4 wherein DATA-IN signals are provided on the same bus means as DATA-OUT signals.

6. The method of claim 1 wherein the speed of said clock means is matched to that of slid memory means.

7. The method of claim 4 wherein first flip-flop means stores ADDRESS information.

8. The method of claim 7 wherein second flip-flop means stores DATA information.

9. The method of claim 8 wherein third flip-flop means stores Read/Write commands.

10. The method of claim 8 wherein fourth flip-flop means stores DATA-OUT and is also initiated by said clock signals.

11. The method of claim 8 wherein the inputs of said third flip-flop means is coupled to said memory means via inverter means I.

12. The method of claim 11 wherein said second flip-flop means is coupled from an output-enable terminal thereof to said inverter means.

13. The method of claim 7 wherein the DATA-IN output of said second flip-flop means is coupled to said unit M via output data bus means from memory means.

14. A method for controlling a high speed memory unit to be read from and written to as initiated by clock signals from clock means of comparable speed, this method involving:

providing timing coordinator means with bi-stable store means for storing and presenting certain input signals to said memory unit in conjunction with said clock signals so as to be immediately useable by the memory unit, and so that this unit can responsively output data to user means;

said input signals being arranged to include commands to Read or Write, plus Address signals and Data signals;

said memory unit also being maintained in "ready-to-read" condition at all times except during receipt of write commands.

* * * * *